US010302720B2

(12) United States Patent
Kannengiesser et al.

(10) Patent No.: US 10,302,720 B2
(45) Date of Patent: May 28, 2019

(54) METHOD AND APPARATUS FOR DETERMINING DEPHASING FACTORS IN MAGNETIC RESONANCE IMAGING AND SPECTROSCOPY

(71) Applicant: Siemens Healthcare GmbH, Erlangen (DE)

(72) Inventors: Stephan Kannengiesser, Wuppertal (DE); Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 449 days.

(21) Appl. No.: 15/154,015

(22) Filed: May 13, 2016

(65) Prior Publication Data
US 2016/0334482 A1 Nov. 17, 2016

(30) Foreign Application Priority Data

May 13, 2015 (DE) .................. 10 2015 208 939

(51) Int. Cl.
*G01R 33/46* (2006.01)
*G01R 33/48* (2006.01)

(52) U.S. Cl.
CPC ......... *G01R 33/46* (2013.01); *G01R 33/4828* (2013.01); *G01R 33/4625* (2013.01)

(58) Field of Classification Search
CPC ........... G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838
See application file for complete search history.

(56) References Cited

U.S. PATENT DOCUMENTS

| 2005/0200356 | A1 | 9/2005 | Hennig | |
|---|---|---|---|---|
| 2008/0218169 | A1 | 9/2008 | Bookwalter et al. | |
| 2009/0156927 | A1* | 6/2009 | Schmidt | A61B 5/055 600/420 |
| 2011/0092801 | A1* | 4/2011 | Gross | A61B 5/015 600/412 |

(Continued)

OTHER PUBLICATIONS

Eggers, "Water-Fat Identification in Dual-Echo Dixon Imaging"; Proc. Intl. Soc. Mag. Reson. Med.; vol. 20; p. 365, (2012).

(Continued)

*Primary Examiner* — Tung X Nguyen
(74) *Attorney, Agent, or Firm* — Schiff Hardin LLP

(57) ABSTRACT

In a method and apparatus for determining time-dependent dephasing factors of at least one spectral component of at least two spectral components in a region of interest in an object under examination, measured data of the region of interest and acquired over time by a test measurement in a magnetic resonance scanner. The contribution of at least one of the at least two spectral components in the recorded measured data is determined. Dephasing factors of the at least one spectral component are determined on the basis of the contribution determined therefor in the recorded measured data over time. Dephasing factors determined in this way can be determined individually with relatively little effort and used in Dixon techniques.

13 Claims, 3 Drawing Sheets

(56) References Cited

U.S. PATENT DOCUMENTS

2013/0082705 A1* 4/2013 Landschuetz ........ G01R 33/565
                                                   324/309

OTHER PUBLICATIONS

Yu et al. "Multiecho Water-Fat Separation and Simultaneous $R^*_2$ Estimation with Multifrequency Fat Spectrum Modeling"; Magn. Resonance in Medicine vol. 60, pp. 1122-1134 (2008).

Bacher, et al; "Signal Model Consistency Analysis of Different Protocols and Spectral Models in Multi Gradient Echo Liver PDFF and $R_2^*$ Quantification"; Proc. Intl. Soc. Mag. Reson. Med.; vol. 22; p. 1672; (2014).

Pineda et. al.: "Measurement of Hepatic Lipid :High-Speed T2-Corrected Multiecho Acquisition at $^1$H MR Spectroscopy—A Rapid and Accurate Technique"; Radiology; vol. 252; No. 2 pp. 568-576; (2009).

Ren et.al.: "Composition of adipose tissue and marrow fat in humans by $^1$H NMR at 7 Tesla", Journal of Lipid Research, vol. 49, pp. 2055-2062, (2008).

Reeder,et al.; "Proton Density Fat-Fraction: A Standardized MR-Based Biomarker of Tissue Fat Concentration", Journal of Magnetic Resonance Imaging; vol. 36; pp. 1011-1014; (2012).

Hernando, et. al; "Multipeak Fat-Corrected Complex R2* Relaxometry: Theory, Optimization, and Clinical Validation"; Magnetic Resonance in Medicine; vol. 70; pp. 1319-1331; (2013).

Hamilton et al.: "In vivo Characterization of the liver fat $^1$H MR spectrum", NMR Biomed 2011, 24, pp. 784-790; (2011).

Provencher, : "Estimation of Metabolite Concentrations from Localized in Vivo Proton NMR Spectra", in: Magnetic Resonance in Medicine, vol. 30, pp. 672-679; (1993).

\* cited by examiner

FIG 3
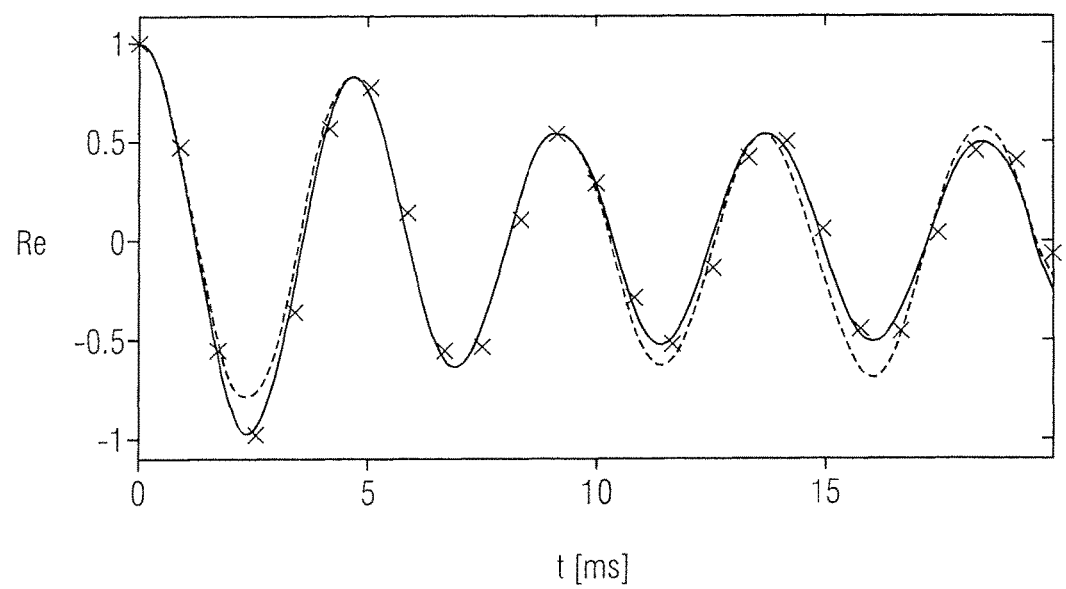
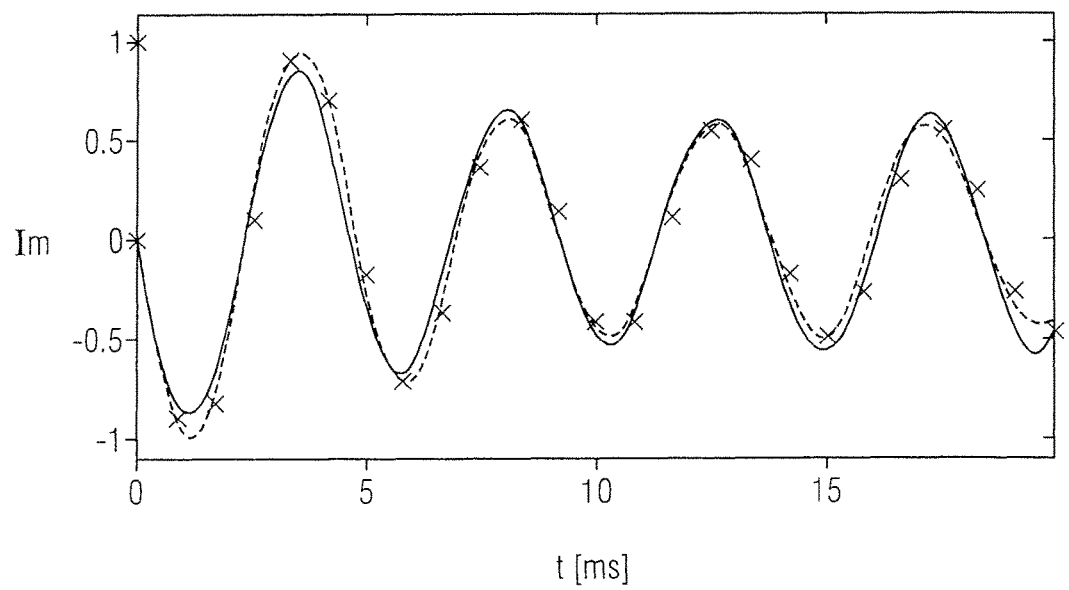

METHOD AND APPARATUS FOR DETERMINING DEPHASING FACTORS IN MAGNETIC RESONANCE IMAGING AND SPECTROSCOPY

BACKGROUND OF THE INVENTION

1. Field of the Invention

The invention concerns the determination of time-dependent dephasing factors of at least one spectral component of at least two spectral components in a region of interest in an object under examination by magnetic resonance (MR) test measurements, and a method for using the determined dephasing factors. The invention also concerns a magnetic resonance system and a non-transitory, electronically readable data carrier for implementing such a method.

2. Description of the Prior Art

Magnetic resonance (MR) is a known modality with which images of the interior of an object under examination can be generated. In simple terms, the object under examination is positioned in a magnetic resonance scanner in a strong static homogeneous basic magnetic field, also called a $B_0$ field, with field strengths of 0.2 tesla to 7 tesla and more so that the nuclear spins of the object are oriented along the basic magnetic field. To excite magnetic resonance of the nuclear spins, radio-frequency excitation pulses (RF pulses) are radiated into the object under examination, the excited nuclear spins emit signals that are measured as so-called k-space data, which are used as the basis for the reconstruction of MR images or the determination of spectroscopy data. Rapidly switched magnetic gradient fields are superimposed on the basic magnetic field for spatially encoding the measured data. The measured data recorded are digitized and stored as complex numbers in a so-called k-space matrix. An associated MR image can be reconstructed from the k-space matrix populated with these values, for example by a multidimensional Fourier transformation.

During MR measurements of nuclear spins, it is possible to separate spectral components included in MR data. The spectral components can designate different spin species, for example nuclear spins in a fat environment and in an aqueous environment. To this end, often so-called chemical shift imaging multi-echo MR measurement sequences are used within the context of Dixon techniques. Such techniques typically make use of the fact that the resonance frequency of nuclear spins depends on the molecular and/or chemical environment. This effect is known as the chemical shift. Hence, different spin species have different resonance frequencies from which the measured spectrum of the MR data is composed. For example, the difference between two resonance frequencies of different spectral components can be expressed in ppm ("parts per million", i.e. $10^{-6}$).

Many chemical species, for example water, have monofrequency MR spectra. Others, such as fat, have a non-monofrequency MR spectrum. Others have multiple, coupled resonances with a known amplitude ratio, a known phase position, if applicable, and known frequency differences. This advance knowledge can be utilized during the determination of the total signal from these species, see for example Provencher et al. "SW. Estimation of metabolite concentrations from localized in vivo proton NMR spectra" MRM 30: 672 (1993).

The MR signal of hydrogen nuclear spins in water is often considered to be a first spectral component and that of hydrogen nuclear spins in fatty acid chains to be a second spectral component. In such a case, MR data can be used to determine a water MR image and a fat MR image, i.e. in each case individual MR images of the two spectral components. This is of interest for a wide variety of clinical and/or medical applications.

In order to be able to separate the spectral components from one another, in the context of the Dixon technique, MR signals are acquired at a number of echo times after the excitation. The combined MR signals form the MR data. The different spectral components have different phase positions and amplitudes at the different echo times. Taking this effect into account enables the quantities of the chemical species to be determined separately.

For this purpose, a signal model is usually used that links the measured or acquired MR data with different physically relevant variables. The different variables can be the different spectral components to be determined, the spectra thereof, and—depending upon the precision, scope and complexity of the signal model—further unknown aspects of the measuring system. This can enable the spectral components that are taken into account in the signal model to be determined for each image element of the MR data.

The spectral model for fat as a spectral component is, for example, known from Hamilton G. et al. "In vivo characterization of the liver fat 1H MR spectrum" NMR Biomed. 24: 784-790 (2011).

However, the results can vary depending upon the spectral model that is selected, because in each case different assumptions can be made regarding the properties of the underlying spectrum of the fat.

Although the fat spectra can be calibrated individually in accordance with the procedure of Hamilton et al. in order for this procedure to be used as part of the signal model for Dixon techniques, a high time expenditure and a high degree of expertise and experience are required. In addition, in the case of Dixon techniques with only a few echo times, the fat spectrum is only evaluated for a correspondingly low number of complex-valued dephasing factors (phase position and amplitude) in the time range.

SUMMARY OF THE INVENTION

An object of the present invention is to enable a simpler determination of the different dephasing factors of the different spectral components in a region of interest of an object under examination at different echo times, in particular without having to make possibly incorrect assumptions regarding the spectra of the different spectral components.

This object is achieved by a method according to the invention for determining time-dependent dephasing factors of at least one spectral component of at least two spectral components in a region of interest in an object under examination, which includes the following steps.

Measured data of the region of interest over time are acquired in a test measurement made by operation of an MR data acquisition scanner. The contribution of at least one of the at least two spectral components in the recorded measured data is determined in a computer. Dephasing factors of the at least one spectral component are determined in the computer on the basis of the contribution determined therefor in the recorded measured data over time.

Hence, the method according to the invention provides a simple way of obtaining time-dependent dephasing factors directly from temporally resolved MR test measurements. This enables the dephasing factors also to be determined individually for a specific application and used instead of a theoretically motivated and spectral model requiring complex calibration. Unlike, the previously usual spectral models, in such a case there is no need to consider which properties the spectral model has to have for the desired application since the dephasing factors are determined directly from an object under examination. In addition, the method according to the invention is easier to automate.

This also is a simple way of determining suitable dephasing factors for different types of examination and storing them for later use. For example, for liver examinations, it is possible to determine and store a set of "liver dephasing factors" from measured data from test measurements on the liver and further sets of application-based dephasing factors from measured data from analogous application-specific test measurements. One special application is phantom measurements, with which, for example, the fat spectrum can have different forms depending on the substances used and different chemical shifts relative to water depending upon the temperature.

If only individualization of the dephasing factors with respect to the application is desired but, for example, no individualization specific to the object under examination (for example in order to obtain better comparability of the results for different objects under examination), it is also possible to employ a broader test measurement base in order to apply the application-specific set of dephasing factors with a broad group of objects under examination.

A method according to the invention for acquiring magnetic resonance data of a first spectral component and a second spectral component of an object under examination by use of a Dixon technique includes the following steps.

Magnetic resonance data are acquired by operating an MR data acquisition scanner to execute a Dixon sequence. Dephasing factors of at least the first or the second spectral component are determined with the method according to the invention described above. The first and second spectral components in the magnetic resonance data acquired by with the Dixon sequence are determined using the acquired magnetic resonance data and the determined dephasing factors.

The use of dephasing factors determined according to the invention instead of the conventional spectral model enables the individual dephasing of the object under examination examined with the Dixon technique in the evaluation of the image data obtained. This enables better separation of the different spectral components in the image data.

A magnetic resonance apparatus according to the invention has a data acquisition scanner that has a basic field magnet, a gradient coil arrangement, a radio-frequency antenna and a control computer designed to implement the method according to the invention. The control computer has a dephasing determination module.

A non-transitory, electronically readable data storage medium according to the invention has electronically readable control information, which at least includes computer code that, when the data carrier is loaded into a control computer of a magnetic resonance scanner, causes the scanner to execute the method according to the invention.

The advantages and embodiments described with respect to the method apply analogously to the magnetic resonance apparatus and the electronically readable data carrier.

BRIEF DESCRIPTION OF THE DRAWINGS

FIG. 3 is a comparison of dephasing factors determined according to the invention with dephasing factors determined on the basis of a spectral model.

DESCRIPTION OF THE PREFERRED EMBODIMENTS

Figure 1:
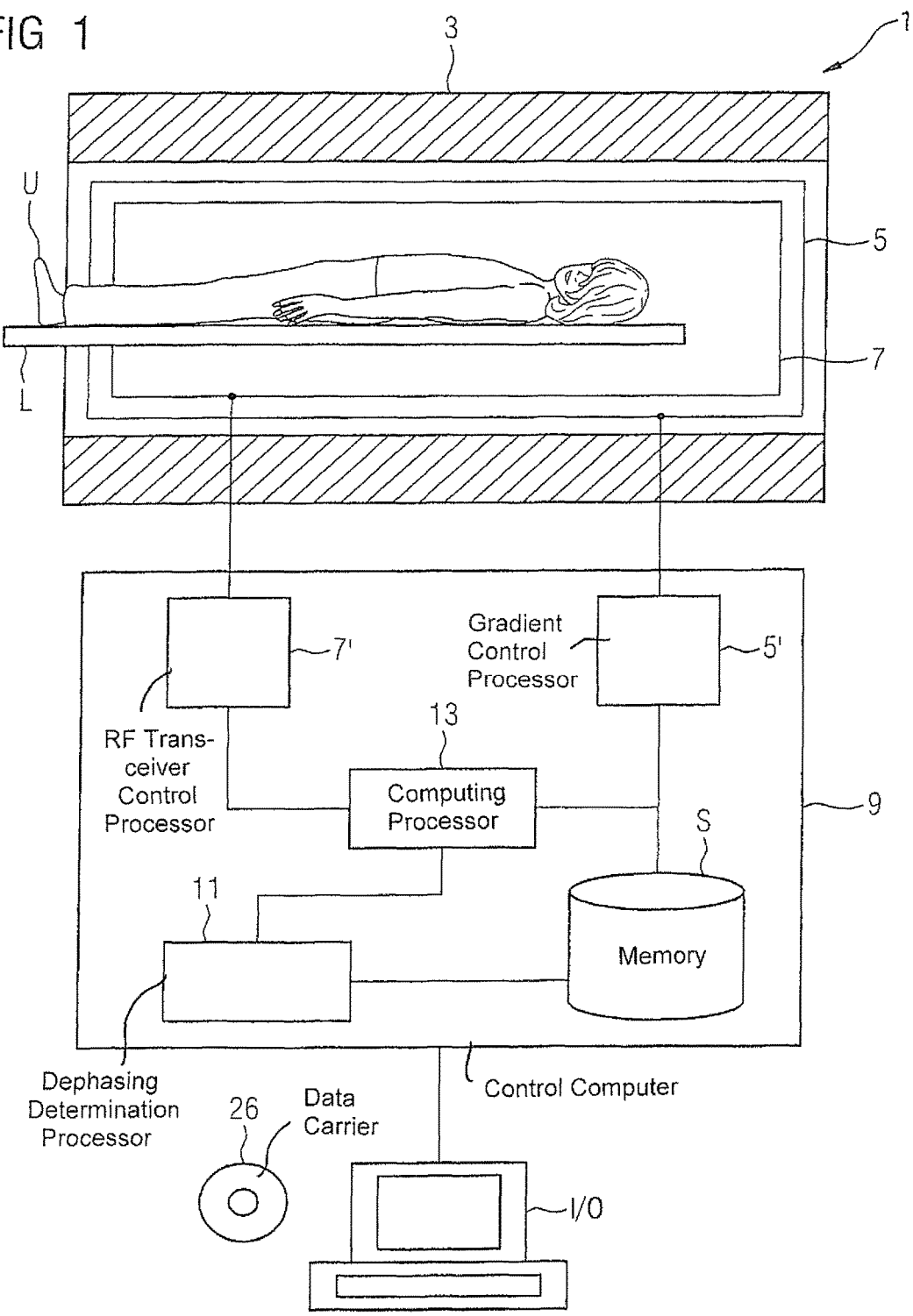
FIG. 1 schematically illustrates a magnetic resonance apparatus according to the invention.

FIG. 1 is a schematic illustration of a magnetic resonance apparatus 1 according to the invention. This apparatus has an MR data acquisition scanner with a basic field magnet 3 for the generation of the basic magnetic field, a gradient coil arrangement 5 for the generation of the gradient fields, a radio-frequency antenna 7 for radiation and reception of radio-frequency signals, and a control computer 9 designed to carry out a method according to the invention. In FIG. 1, these components of the magnetic resonance apparatus 1 are only schematically depicted in a simplified way. For example, the radio-frequency antenna 7 can be formed by multiple sub-units, in particular a number of coils, which can be designed only to emit radio-frequency signals, only to receive the radio-frequency signals, or to do both.

To examine an object under examination U, for example a patient or a phantom, the object can be introduced into the magnetic resonance scanner in the measuring volume thereof on a bed L.

The control computer 9 is used to control the magnetic resonance scanner and can control the gradient coil arrangement 5 via a gradient control processor 5' and the radio-frequency antenna 7 via a radio-frequency transceiver control processor 7'. The control computer 9 further has a dephasing determination processor 11, by which the control computer 9 can carry out the steps required for the method according to the invention for determining dephasing factors (see FIG. 2). To this end, a computing processor 13 of the control computer 9 is designed to carry out all the computing operations required for the necessary measurements and determinations. The intermediate results and results required to this end or determined hereby can be stored in a memory S of the control computer 9.

A user can use an input/output device I/O of the magnetic resonance apparatus 1 to forward control commands to the magnetic resonance system and/or results of the control computer 9 such as image data or the dephasing factors determined.

The methods described herein can be provided individually or separately including in the form of a computer program which implements the respective method on a control computer 9, when it is executed on the control computer 9. It is also possible for an electronically readable data carrier 26 to be provided with electronically readable control information stored thereon, that includes at least one computer program as described above and is embodied such that, when the data carrier 26 is loaded in a control computer 9 of the magnetic resonance apparatus 1, it carries out the described method or methods.

Figure 2:
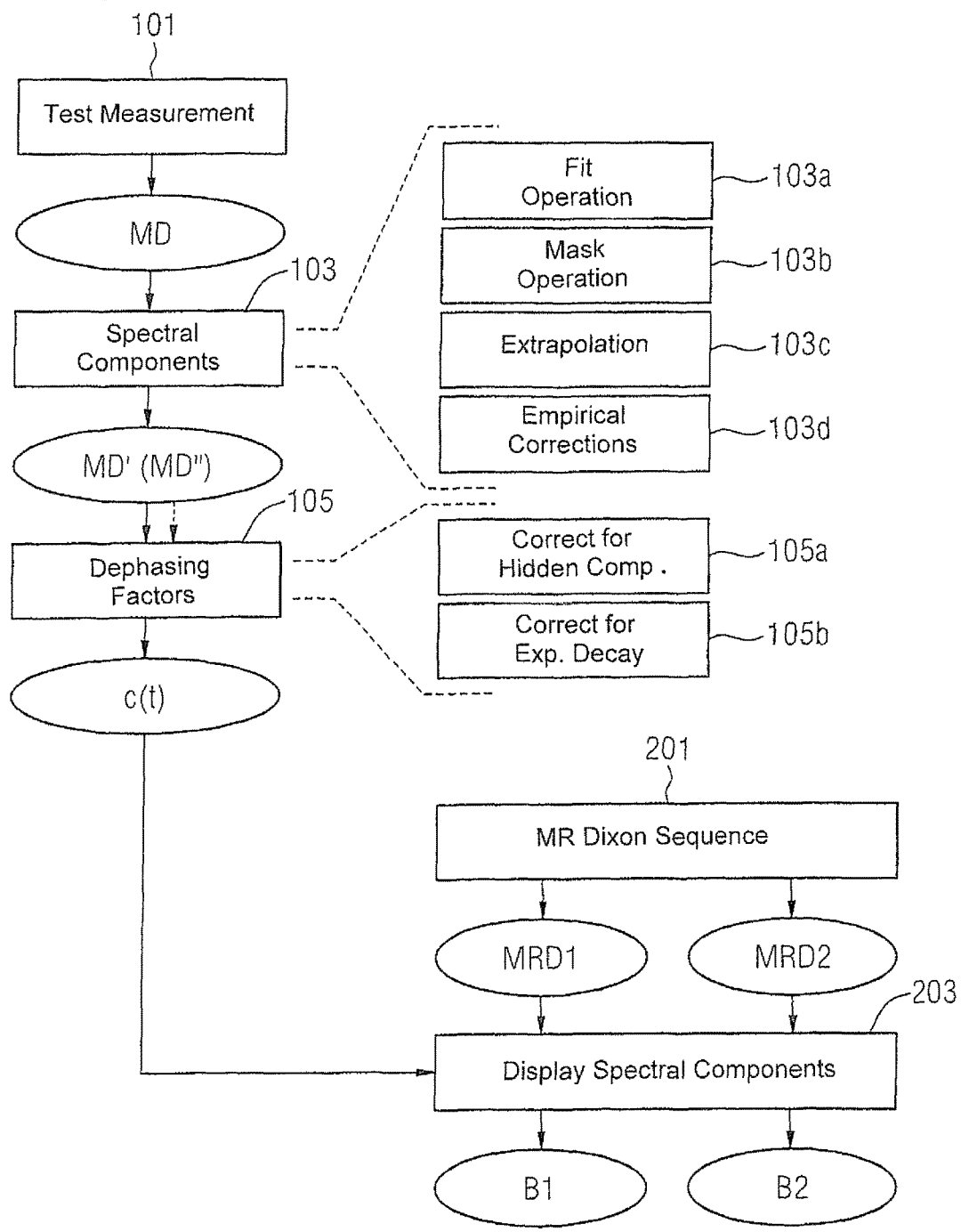
FIG. 2 is a flowchart of the method according to the invention.

FIG. 2 is a flowchart illustrating the method according to the invention for determining time-dependent dephasing factors of at least one spectral component of at least two spectral components in a region of interest in an object under examination and the method for acquiring magnetic resonance data of a first spectral component and a second spectral component of an object under examination by means of a Dixon technique.

For a method according to the invention for determining time-dependent dephasing factors of at least one spectral component of at least two spectral components in a region of interest in an object under examination, first measured data MD of the region of interest are recorded over time in a test measurement 101. In principle, suitable techniques for recording this measured data MD are any MR measuring techniques which are able to measure the decay of an excitation of the spectral components to be measured, in particular the free induction decay (FID) with sufficient temporal or spectral resolution in order to apply a meaningful continuous curve over the measuring points of the measured data MD. The determination of the dephasing factors c(t) then comprises a determination of the FID in the measured data of the test measurement, the determination of the dephasing factors comprises a determination of the free induction decay (FID) of the measured data of the test measurement. In one embodiment of the method, the measured data MD is acquired in a test measurement 101 in measuring points with a time interval of one millisecond or less in order to depict the temporal course sufficiently accurately.

If, in this case, a MR sequence is used for an imaging MR measurement, it is necessary to record a correspondingly high number of echoes with corresponding echo spacing. From a technical viewpoint, spectroscopic measurements are as a rule more suitable for meeting these requirements with respect to temporal resolution. One example of a spectroscopic measurement that can be used to this end is a STEAM sequence ("stimulated echo acquisition mode"). In this case, the measured data MD is preferably recorded voxel-by-voxel.

In this case, the region of interest in which the measured data MD is recorded in the object under examination can be selected automatically or manually in accordance with the conditions adapted for the desired examination. In particular, the region of interest can be selected such that the highest possible signal strength can be achieved for the spectral component in the object under examination for which the dephasing factors c(t) are to be determined.

In a further step 103, the contribution MD' of at least one of the at least two spectral components in the recorded measured data MD is determined. This can be performed with methods which are in principle known in the field of spectral analysis, as will be briefly outlined below.

Here, depending upon the nature of the spectral structure of the spectral components present in the region of interest, for one of the at least two spectral components, it can be easier to determine its contribution to the recorded measured data MD. For example, when one of the two spectral components is water, due to its relatively simple spectral structure, its contribution can be determined very accurately. If the dephasing factors are to be determined for another spectral component for which the contribution cannot be determined so directly, the contribution MD' thereof can, for example, be determined by subtracting the easier-to-determine contribution MD" or contributions MD" from the recorded measured data MD.

If, for example, the spectral components of the region of interest are water and fat, the contribution of one of the spectral components, for example fat, MD' can be determined by subtracting the more easily and more directly determined contribution MD" of the other spectral component, for example water,: MD'=MD−MD".

With the determination of the contribution MD', MD" of a spectral component to the measured data MD, it is in particular possible to use a fit operation 103a, for example a Lorentz fit, to determine the contribution of water with which the determination of the dephasing factors c(t) includes at least one fit operation 103a in the time domains of the measured data MD in the test measurement 101.

Following the deduction of the contribution of a spectral component from the measured data MD, it is possible to adapt the frequency of the curve plotted in the remaining measuring points in order to increase the accuracy.

To improve the accuracy of the separation of the contributions of the different spectral components, it is additionally or alternatively possible to use a mask operation 103b in order for example to be able to compensate any possible errors in the measured values. In this case, it is possible to set contributions to the previously determined contributions MD' lying outside a predetermined spectral range to "zero" (so-called "zero filling"). In this case, the predetermined spectral range is predetermined in accordance with the spectral structure of the spectral components sought in the region of interest.

Furthermore, to improve the accuracy, an extrapolation 103c can be applied to the contributions MD' (at different echo times) by means of a, for example monoexponential, decay model in order to obtain more accurate extrapolated values for MD' in which any relaxation effects are corrected.

A further possibility for increasing the accuracy of the contributions MD' obtained is to use empirical corrections 103d. In this case, it is conceivable to take into account any possible known overlaps in the spectra of the different spectral components. For example, it is known that the spectra of water and fat can intersect. If, therefore, during the determination of the contribution of fat (MD') by subtracting the previously determined contribution of water (MD") from the measured data MD, "too much" was deducted (since in this case, the contributions of the spectrally overlapping fat are omitted), this can be corrected subsequently in accordance with knowledge of the overlapping during the determination of the contribution of fat.

All this enables the temporal range of the underlying measured data MD to be restricted to one region of interest. Hence, it is, for example, possible for noise possibly recorded in the last measuring points of the measured data MD to be "clipped out" again in order to avoid falsification of the result.

Hence, the determination of a contribution MD' of the at least two spectral components in the recorded measured data MD can also include a determination of at least one contribution MD" of another one of the at least two spectral components in the recorded measured data MD.

In a further step 105, the dephasing factors c(t) sought of the at least one spectral component are determined on the basis of the contribution MD' determined for this spectral component in the recorded measured data MD over time.

Here, in a simple case, the contribution MD' of the one spectral component determined can be adopted as the sought dephasing factors c(t).

In another exemplary embodiment, the determination of the dephasing factors c(t) includes scaling, such that the dephasing factors determined c(t) at the time t=0 have a value of one and during a later use of the dephasing factors c(t) at the time t=0 again no dephasing is predicted by the dephasing factors c(t). To this end, the contribution MD' determined is scaled accordingly.

Furthermore, in a substep 105a, a further correction can be performed, for example as a $1^{st}$ order correction for signal components of a spectral component, which, as already described above with respect to 103d, due to overlapping with the signal components of another one spectral component, "are hidden among these". If the percentage of the signal components of the one spectral component, for example fat, which is overlapped by the signal components of another spectral component, for example water is known, initially, instead of pure scaling of the dephasing factors such that the dephasing factors determined c(t) at the time t=0 have a value of one, i.e. to c(0)=1, intermediate scaling c'(t) of the dephasing factors can be performed such that the dephasing factors determined c'(t) at the time t=0 have a value of "one minus s", i.e. to c'(0)=1−s, wherein s is the percentage component of the signal components of the one spectral component, which is overlapped by the signal components of the other spectral component. In this way, the signal components of the desired spectral component, which would otherwise not be taken into account due to the overlapping, can be at least approximately corrected. For example, for the spectral component 'fat in the liver' it is known that approximately 9% of the signal components of fat overlap with the signal components of water so that these would not be taken into account without this correction.

In order to finally arrive again at the desired scaling of the dephasing factors c(t) to one at the time point t=0, s can now be added to the real part of the dephasing factors c'(t) determined by means of the intermediate scaling thus once again achieving a scaling of c(0)=1.

In this case, therefore, the scaling of the dephasing factors c(t) includes an intermediate scaling c'(t) (step 105a) such that that the dephasing factors determined at the time t=0 have a value of one minus the percentage of signal components of the spectral component whose dephasing factors c(t) are determined, which is overlapped by signal components of at least one other spectral component.

Furthermore, it is additionally or alternatively possible to include a correction (step 105b) with respect to the exponential decay of the spectral component whose dephasing factors are determined during the determination of the dephasing factors. This enables a further refinement of the dephasing factors determined c(t) to be achieved. This correction is based on the fact that the line widths of the individual spectral components are inter alia caused by the T2' decay during acquisition by means of the test measurement, wherein T2* is the transversal decay time with T2*=1/R2*. The assumption of a typical T2* time $T_f$ of the spectral component, for example fat, and multiplication of the contribution MD' with $e^{t/T_f}$ corrects the decay in the dephasing factors c(t) obtained in this way.

The aforementioned corrections 105a and 105b can be applied individually or even successively to the contributions MD' determined in order to obtain the dephasing factors c(t).

Due to the voxel-by-voxel processing of the measured data MD, the time-dependent dephasing factors c(t) are also determined voxel-by-voxel from the measured data.

As described above, it is also possible, as indicated by the dashed arrow, in step 105 for a plurality of contributions MD' from a plurality of test measurements to be used as the basis for a set of dephasing factors c(t). In this case, it is, for example, possible for contributions MD' determined from measured data MD recorded on different objects under examination or on different regions of interest in an object under examination to be averaged or even averaged with weighting for the determination of the dephasing factors c(t).

The dephasing factors determined in this way c(t) can now be used with a method for acquiring magnetic resonance data of a first spectral component and a second spectral component of an object under examination by means of a Dixon technique.

In this case, in a first step 201, magnetic resonance data is acquired by means of a Dixon sequence. In this case, at least two MR Dixon data sets MRD1 and MRD2, which were each recorded at the at least two echo times of the Dixon sequence used, are obtained.

From these MR Dixon data records MRD1 and MRD2, it is now possible in a further step 203, after the required dephasing factors c(t) of at least the first or the second spectral component have been determined with an above-described method according to steps 101 to 105, for these dephasing factors to be used to determine and optionally display the first spectral component B1 and the second spectral component B2 from the MR-Dixon data records MRD1 and MRD2.

A signal model, which is used for Dixon methods of this kind for the separation of at least two different spectral components, for example fat and water in recorded image data is as follows: $S(t)=(W+e(t)F)e^{-R^*_2 t+i\varphi(t)}$, wherein S(t) is the complex signal measured at different echo times t, $R^*_2$ is the transversal relaxation rate (which is assumed to be the same for both spectral components W and F), $\varphi(t)$ is an additional phase evolution, W is the signal of the first spectral component (for example water) and F the signal of the other spectral component (for example fat).

In the Dixon method described, here dephasing factors c(t) determined according to the invention are used for c(t), for example, separate image data is obtained for the first spectral component B1 (for example water) and the second spectral component B2 (for example fat).

FIG. 3 is a comparison of dephasing factors determined according to the invention (crosses and dashed line) with dephasing factors determined on the basis of a spectral model in accordance with the aforementioned article by Hamilton (continuous line). In the example shown, the upper graph shows the real part $c_x(t)$ of the dephasing and the lower graph the imaginary part $c_y(t)$ of the dephasing. As can be seen, there is a high degree of conformance.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining time-dependent dephasing factors of at least one spectral component among at least two spectral components acquired in a magnetic resonance (MR) examination of a region of interest in an examination subject, said method comprising:
   operating an MR data acquisition scanner to execute a test measurement to acquire test measurement MR data over time of a region of interest of an examination subject situated in the MR data acquisition scanner, said test measurement MR data representing at least two spectral components;
   providing the test measurement MR data to a computer and, in said computer, automatically determining a contribution over time of at least one spectral component among said at least two spectral components represented in the test measurement MR data;
   in said computer, automatically determining dephasing factors of said at least one spectral component dependent on the contribution over time thereof in the test measurement MR data; and
   making an electronic signal available from said computer that represents the determined dephasing factors.

2. A method as claimed in claim 1 comprising operating said MR data acquisition scanner to execute a STEAM (Stimulated Echo Acquisition Mode) spectroscopy sequence as said test measurement.

3. A method as claimed in claim 1 wherein said region of interest comprises a volume, and comprising operating said MR data acquisition scanner to acquire said test measurement MR data in said test measurement voxel-by-voxel from said volume.

4. A method as claimed in claim 1 comprising automatically determining said dephasing factors by determining the free induction decay (FID) in the test measurement MR data.

5. A method as claimed in claim 1 comprising automatically determining said dephasing factors by determining respective contributions of said at least two spectral components in said test measurement MR data, and determining a contribution of another spectral component, among said at least two spectral components, represented in said test measurement MR data.

6. A method as claimed in claim 1 comprising automatically determining said dephasing factors by executing at least one algorithm applied to the test measurement MR data, said at least one algorithm being selected from the group consisting of a fit algorithm, a mask operation algorithm, and extrapolation algorithm using a decay model, and an empirical correction algorithm.

7. A method as claimed in claim 1 comprising automatically determining said dephasing factors by giving dephasing factors determined for a time t=0 a value of one, and scaling respective dephasing factors, with respect to said value of one, that occur following said time t=0.

8. A method as claimed in claim 7 comprising scaling said respective dephasing factors with an intermediate scaling that gives dephasing factors determined at the time t=0 a value of one minus a percentage of signal contributions of the spectral component for which the dephasing factors are being determined, which is overlap by signal contributions of at least one other spectral component among said at least two spectral components.

9. A method as claimed in claim 1 comprising automatically determining said dephasing factors as a correction with respect to an exponential decay of the spectral component for which the dephasing factors are being determined.

10. A method as claimed in claim 1 comprising acquiring said test measurement MR data in said test measurement at respective measuring points separated by a time interval of 1 millisecond or less.

11. A method for determining time-dependent dephasing factors of at least one spectral component among at least two spectral components acquired in a magnetic resonance (MR) examination of a region of interest in an examination subject, said method comprising:
  operating an MR data acquisition scanner to execute a Dixon technique to acquire MR data over time of a region of interest of an examination subject situated in the MR data acquisition scanner, said MR data representing at least two spectral components;
  providing the MR data to a computer and, in said computer, automatically determining a contribution over time of at least one spectral component among said at least two spectral components represented in the MR data;
  in said computer, automatically determining dephasing factors of said at least one spectral component dependent on the contribution over time thereof in the MR data; and
  making an electronic signal available from said computer that represents the determined dephasing factors.

12. A magnetic resonance (MR) apparatus comprising:
  an MR data acquisition scanner;
  a computer configured to operate said MR data acquisition scanner to execute an MR measurement to acquire measurement MR data over time of a region of interest of an examination subject situated in the MR data acquisition scanner, said measurement MR data representing at least two spectral components;
  said computer being configured to automatically determine a contribution over time of at least one spectral component among said at least two spectral components represented in the measurement MR data;
  said computer being configured to automatically determine dephasing factors of said at least one spectral component dependent on the contribution over time thereof in the measurement MR data; and
  said computer being configured to make an electronic signal available from said computer that represents the determined dephasing factors.

13. A non-transitory, computer-readable data storage medium encoded with programming instructions, said storage medium being loaded into a control and evaluation computer of a magnetic resonance (MR) apparatus that comprises an MR data acquisition scanner, said programming instructions causing said control and evaluation computer to:
  operate the MR data acquisition scanner to execute an MR measurement to acquire measurement MR data over time of a region of interest of an examination subject situated in the MR data acquisition scanner, said measurement MR data representing at least two spectral components;
  automatically determine a contribution over time of at least one spectral component among said at least two spectral components represented in the test measurement MR data;
  automatically determine dephasing factors of said at least one spectral component dependent on the contribution over time thereof in the measurement MR data; and
  make an electronic signal available from said control and evaluation computer that represents the determined dephasing factors.

* * * * *